(12) United States Patent
Barfield

(10) Patent No.: US 9,360,528 B2
(45) Date of Patent: Jun. 7, 2016

(54) METHOD AND SYSTEM FOR VOLTAGE SENSE INPUT

(71) Applicant: GENERAL ELECTRIC COMPANY, Schenectady, NY (US)

(72) Inventor: Kenneth Barfield, Glenville, NY (US)

(73) Assignee: General Electric Company, Schenectady, NY (US)

(*) Notice: Subject to any disclaimer, the term of this patent is extended or adjusted under 35 U.S.C. 154(b) by 404 days.

(21) Appl. No.: 14/070,511

(22) Filed: Nov. 2, 2013

(65) Prior Publication Data

US 2014/0125346 A1 May 8, 2014

Related U.S. Application Data

(60) Provisional application No. 61/721,712, filed on Nov. 2, 2012.

(51) Int. Cl.
| | |
|---|---|
| *H02J 7/16* | (2006.01) |
| *G01R 31/36* | (2006.01) |
| *G01R 19/00* | (2006.01) |
| *H02J 7/00* | (2006.01) |
| *H01M 10/637* | (2014.01) |

(52) U.S. Cl.
CPC ............ *G01R 31/3606* (2013.01); *G01R 19/00* (2013.01); *H02J 7/0029* (2013.01); *H02J 7/0091* (2013.01); *H01M 10/637* (2015.04)

(58) Field of Classification Search
CPC ... H02J 7/0029; H02J 7/0091; H01M 10/637; G01R 19/00; G01R 31/3606
USPC ............... 320/134, 145, 157; 324/76.39, 114, 324/426; 363/89
See application file for complete search history.

(56) References Cited

U.S. PATENT DOCUMENTS

| | | | |
|---|---|---|---|
| 2002/0089866 A1* | 7/2002 | Keim | H02J 7/0054 363/89 |
| 2009/0174393 A1* | 7/2009 | Dishman | H02M 3/33515 324/114 |

* cited by examiner

*Primary Examiner* — Edward Tso
*Assistant Examiner* — Aaron Piggush
(74) *Attorney, Agent, or Firm* — Dority & Manning, P.A.

(57) ABSTRACT

A circuit that includes a bridge rectifier configured to convert a sensed input signal into a rectified output signal and a regulator configured to convert the rectified output signal into a voltage source signal. The circuit further includes a variable period timer configured to be powered by the voltage source signal and to convert the rectified output signal into a low duty cycle timer signal in which 50% is a low duty cycle and the low duty cycle timer signal has a frequency that is correlated to an input voltage level of the sensed input signal, wherein the voltage sensing circuit is configured to operate on input voltage levels of sensed alternating current (AC) and direct current (DC) input signals over one or more determined dynamic ranges.

20 Claims, 3 Drawing Sheets

METHOD AND SYSTEM FOR VOLTAGE SENSE INPUT

CROSS-REFERENCE TO RELATED APPLICATIONS

This application claims the benefit of U.S. Provisional Patent Application No. 61/721,712, filed on Nov. 2, 2012, entitled "Battery Management Systems and Methods" which is herein incorporated by reference in its entirety.

TECHNICAL FIELD

Embodiments of the subject matter disclosed herein relate to battery management circuitry designs.

BACKGROUND

Battery management systems can include various components, circuitry, hardware, and the like. For instance, a circuit can be utilized to engage and/or disengage a contactor or relay. Yet, conventional techniques often include costly components or circuitry and lack response time for opening or closing the contactor or relay. Additionally, battery management systems can include a temperature sensing device. Conventional circuits or components include costly linear devices that detect a temperature. Battery management systems can include isolating circuits or components that eliminate noise or interference from a transmission point to a reception point.

It may be desirable to have a system and method that differs from those systems and methods that are currently available.

BRIEF DESCRIPTION

In an embodiment, a universal isolated voltage sensing circuit is provided. The universal voltage sensing circuit includes a bridge rectifier configured to convert a sensed input signal into a rectified output signal, a regulator configured to convert the rectified output signal into a voltage source signal, and a variable period timer configured to be powered by the voltage source signal and to convert the rectified output signal into a low duty cycle timer signal (e.g., where 50% or less is a low duty cycle) having a frequency that is correlated to an input voltage level of the sensed input signal, wherein the universal voltage sensing circuit is configured to operate on input voltage levels of sensed alternating current (AC) and direct current (DC) input signals over one or more determined dynamic ranges. The circuit provides voltage isolation from the input to the output. The circuit outputs a variable frequency output where the transmitted frequency is relative to the sensed input voltage. The signal transmitted over the isolation barrier has low duty cycle, which allows the circuit to be low power, even for high sensed input voltages.

BRIEF DESCRIPTION OF THE DRAWINGS

Reference is made to the accompanying drawings in which particular embodiments and further benefits of the disclosed battery management circuitry designs are illustrated as described in more detail in the description below, in which.

DETAILED DESCRIPTION

Figure 1:
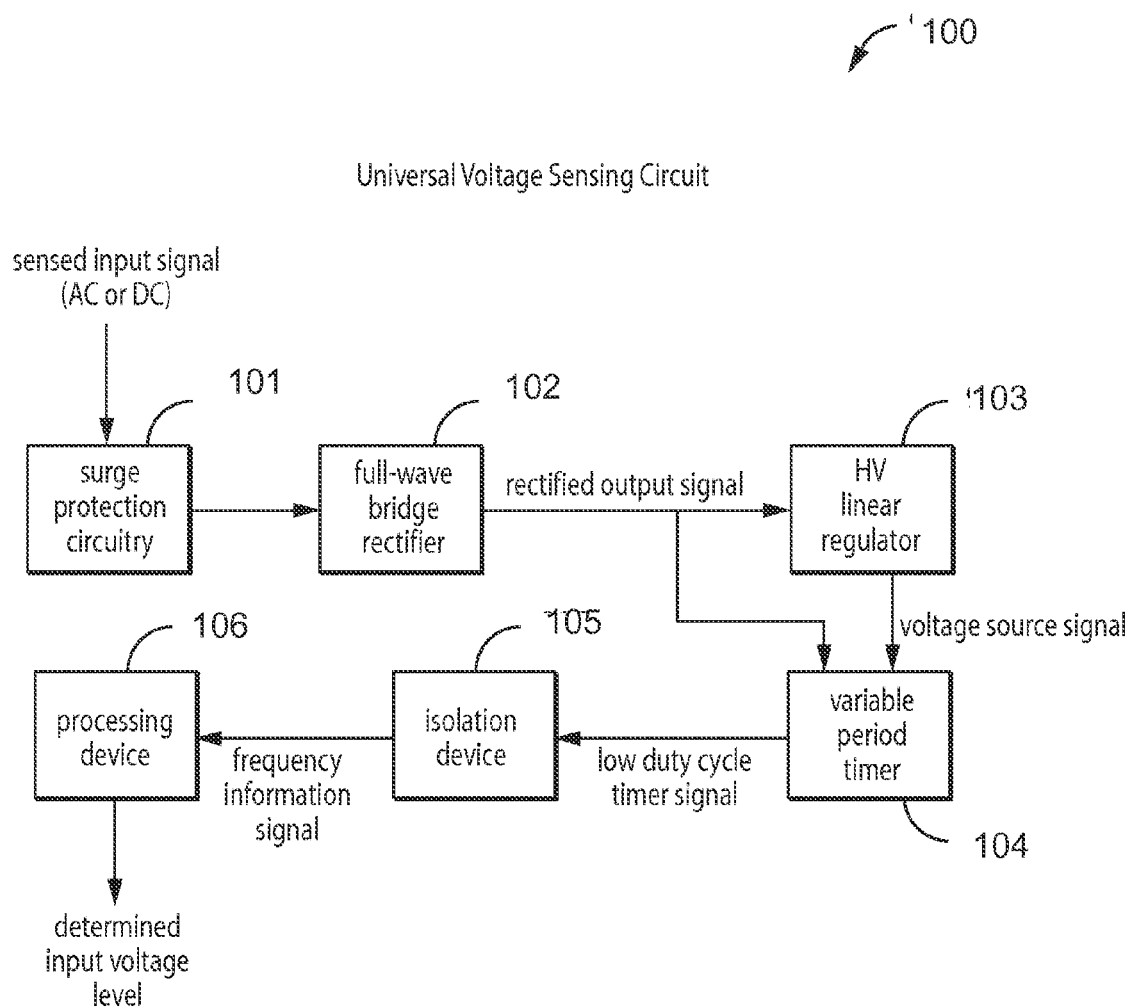
FIG. 1 is an illustration of a block diagram of an embodiment of a system for isolating a signal.

With reference to the drawings, like reference numerals designate identical or corresponding parts throughout the several views. However, the inclusion of like elements in different views does not mean a given embodiment necessarily includes such elements or that all embodiments include such elements.

The term "component" as used herein can be defined as a portion of hardware, a portion of software, or a combination thereof. A portion of hardware can include at least a processor and a portion of memory, wherein the memory includes an instruction to execute.

Figure 2:
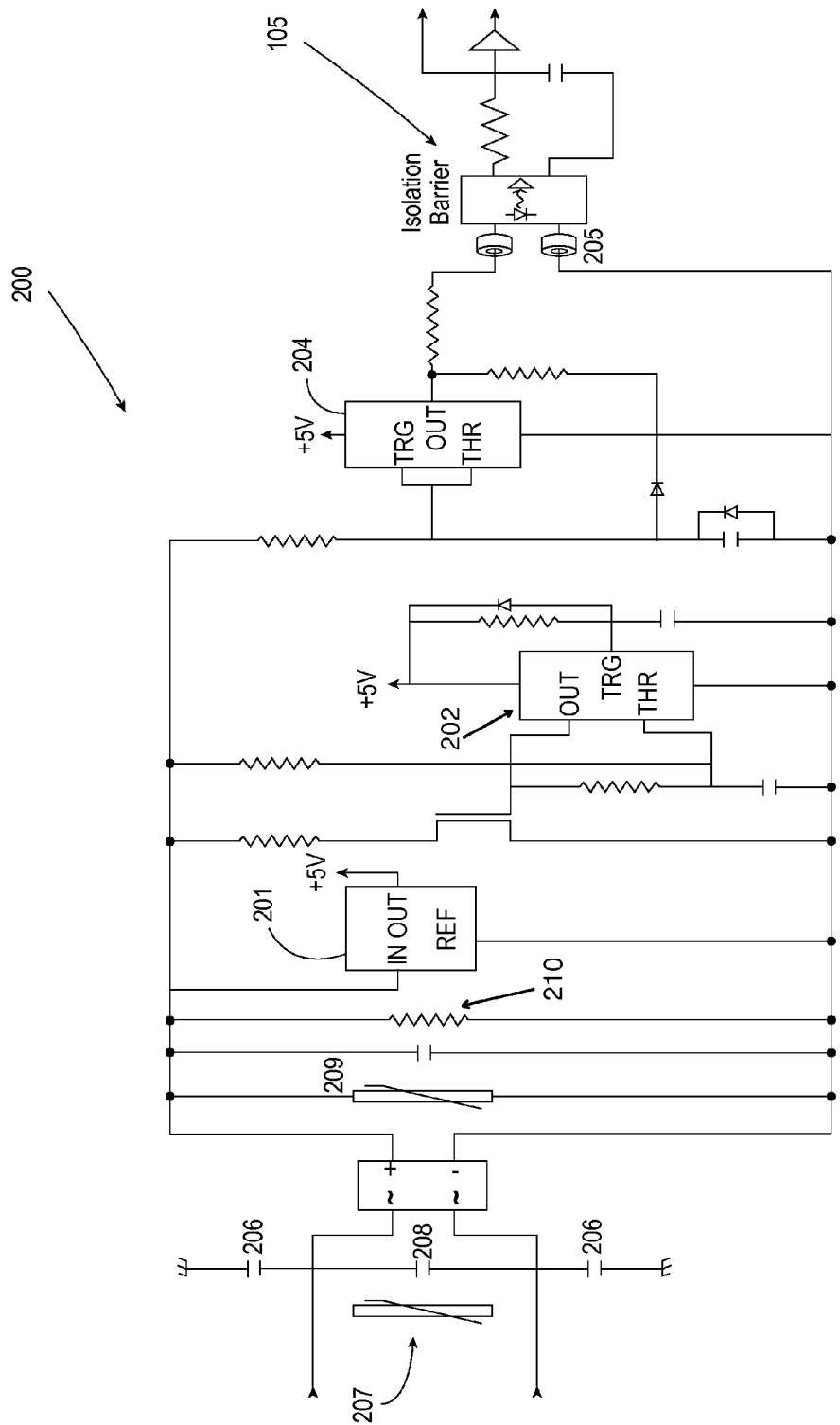
FIG. 2 is an illustration of an embodiment of a circuit for isolating a signal.

FIG. 1 is an illustration of a system 100 for isolating a signal. FIG. 2 illustrate circuit 200 that illustrate universal voltage sensing circuits.

Referring to the FIG. 1, a block diagram of the universal voltage sensing circuit 100 (UVSC) is depicted. The circuit includes surge protection circuitry 101, a full-wave bridge rectifier 102, a high voltage (HV) regulator 103, a variable period timer 104, an isolation device 105, and a processing device 106. In accordance with an embodiment, input signals having voltage levels spanning a wide dynamic range and being of AC or DC types may be input to the UVSC and a voltage level of such an input signal may be accurately determined.

Signals may often exist in a hostile environment and can have damaging surges (voltages and currents) imposed on them which could damage the UVSC. Therefore, providing a surge protection circuitry may help to protect the UVSC against such damaging surges. The full-wave bridge rectifier is configured to convert the sensed input signal into a rectified output signal. For example, if the sensed input signal is an AC signal, the resultant rectified output signal may be a pulsed DC signal. The sensed input signal is an external signal e.g. a voltage signal that is inputted into the battery device. Such a signal may be indicative of a fault (e.g. Fire alarm) in the external environment. The function of the universal surge protection circuitry is to sense such a signal, convert it into a low voltage DC signal for further action through a processing device (e.g. a CPU).

The rectified output signal may be provided to the HV regulator to form a voltage source signal from the rectified output signal. In accordance with an embodiment, the voltage source signal may be a 5 VDC signal. The variable period timer accepts the rectified output signal and the voltage source signal. The variable period timer is powered by the voltage source signal which is derived from the rectified output signal. The variable period timer converts the rectified output signal to a low duty cycle timer signal (e.g., where 50% or less is a low duty cycle) having a frequency that is correlated to the input voltage level of the originally sensed input signal. That is, the variable period timer runs at a frequency that is determined by the input voltage level. The duty cycle of the timer signal may be about 10% or 15%, in accordance with an embodiment. Therefore, power dissipation of the UVSC is reduced by operating at a low duty cycle as indicated in Table 1 below:

TABLE 1

Variable period timer influences the duty cycle thereby ensuring lower voltage and reduced heat dissipation

 High Frequency Duty Cycle

TABLE 1-continued

Variable period timer influences the duty cycle thereby ensuring lower voltage and reduced heat dissipation

Low Frequency Duty Cycle

The low duty cycle timer signal may be provided to the isolation device to help isolate signals being sensed remotely in a hostile external environment where the common mode voltage may not be known. The function of the isolation device is to ensure that the battery system is isolated in case of issues in the external environment (e.g., fire, flood, and the like). In accordance with an embodiment, the isolation device may be an optocoupler device. However, other types of isolation devices may be used, in accordance with embodiments. The isolation device outputs a frequency information signal communicating frequency information of the low duty cycle timer signal to the processing device.

Since the frequency is correlated to the voltage level of the sensed input signal, the processing device reads or determines the frequency and, therefore, determines the corresponding input voltage level. The processing device may be a simple frequency counting device, in accordance with an embodiment. The processing device may be a software programmable device that includes, for example, a microprocessor that is configured to sample the frequency information signal and execute software instructions to read or determine the frequency, in accordance with another embodiment.

In an embodiment, the processor can decipher the input sensed voltage (e.g., AC voltage or DC voltage) and/or what the value of the voltage is (e.g., using a back calculation). In the text that follows it should be understood that the processor monitoring the input voltage really means that the processor monitors the isolated pulse train representation of the input voltage applied to the UVSC. A DC voltage input monitored by the processor will be steady within some tolerance and will not have large variation at the AC power frequency. An AC voltage input will be rectified by the input stages of the UVSC and will appear as a pulsing voltage with twice the frequency of the original AC voltage. Further, when the input voltage is AC the resultant voltage monitored at the processor will vary from a peak of square root of 2 times the AC RMS input voltage (associated with the AC peak), to a lower voltage associated with the AC input zero crossing. The lower voltage associated with the zero crossing would be close to zero volts if there was no differential low pass filtration provided by the UVSC after the input rectifier. The UVSC provides low pass filtration to keep the circuit from turning off between AC peaks. The typical filter values will keep the UVSC powered between peaks for the lowest AC input voltage supported by the circuit. The processor will execute an algorithm that decodes the input and determines the voltage and frequency of the input. The invention is not restricted to 60 Hz AC signals. The algorithm run by the processor could apply complex and computationally expensive signal processing routines like Fourier transforms or a simple state machine to determine if an AC or DC input voltage is present. One simple solution is to implement a state machine that monitors for peak voltages followed by a decay in voltage. The threshold decay could be 50% of the peak voltage. Generally it is not important to calculate the AC input frequency since the value will be widely known. But if needed the frequency can be calculated by the equation: frequency=inverse of 2 times the time between peak voltages, or $f=(2*\text{measured time between peaks})^{-1}$. The AC input voltage is roughly equal to the peak voltage measured divided by the square root of two. Should the measured input voltage not have peaks that meet the established criterion then the input voltage is likely DC and the level is used directly.

In accordance with an embodiment, the UVSC may be configured to handle input voltage levels of sensed AC input signals in a range spanning about 80 volts to about 265 volts, and sensed DC input signals in a range spanning about 20 volts to about 400 volts. Furthermore, in accordance with an embodiment, the UVSC is not implemented as a customized application specific integrated circuit (ASIC) but may be, instead, implemented using lower cost, off-the-shelf components (e.g., discrete components). Such a universal voltage sensing circuit may be used in many signal sensing applications, including those applications where the signals to be sensed exist in remote and/or hostile environments.

Turning to FIG. 2, circuit(s) 200 is provided that provide isolation. It is to be appreciated that circuit(s) is to refer to at least one of the circuits illustrated in FIG. 1 or 2. The circuit(s) provides wide range voltage input and conversion to an isolated output. The circuit(s) works from about 20 volts DC up to 400 volts DC. And from about 80 volts AC up to 265 volts AC. So a battery system could connect directly voltages in the DC range from 20 V to 400 V. This can also be used as a signaling circuit from some external source (e.g., controller, among others). This circuit can be a signaling circuit for use with an external device, controller, switch, among others.

The circuit(s) receive an input signal within a range and then that input is converted to an output signal that is properly interpreted by a component or a portion of software. The circuit(s) includes a discreet component nature (not an ASIC) which can be a low cost off the shelf product. Voltage can enter the circuit(s) with surge protection. The device can be employed in a hostile environment in which a voltage is received from a distance (e.g., 100 meters, 100 yards, etc.). For example, the distance can be based on a location of a possible hostile environment or location of a start of a hostile environment. The circuit(s) also includes a full-wave bridge that converts AC signals into pulsing DC signals, for example.

The circuit(s) can include filter elements such as resistors and/or capacitors. The circuit can include a modification that provides an additional filter element. The circuit(s) includes a high-voltage regulator, in which the rectified signal is converted to a voltage source signal. The circuit(s) can transfer information about that voltage (e.g., rectified voltage) across an isolation barrier without much power dissipation. For instance, a PWM timer device can be utilized. The power dissipation is crucial on this because the large voltage range typically would mean that the low-voltage levels are not determined well based on the size of the components for accommodating the high voltage levels. In this case, the circuit(s) does both. The circuit(s) includes a variable period timer that runs at a frequency that is varied by the input voltage. So if the input voltage is high, then the frequency of the output is fairly high. If the input voltage is low, the frequency is low.

The resistors convert the high-input voltage to a lower power in order to be handled by the timer. To allow this circuit to run without large, expensive heat dissipation or more expensive circuitry, the output of the timer has a low duty cycle so that it is on for at least 10% of the period. So the frequency may vary with the voltage, but the on time is low, which means that the on time is when the isolator chip is being driven which can be a high-power period. So power dissipation is minimized in the circuit by having a low duty cycle. The input to the timer goes through a string of resistors providing a relatively low current, wherein resistors are such that the resistance converts the current to a small amount of current and that current is injected into the timing loop of that timer and allows the input voltage to influence the output frequency.

The output of the timer then goes through more circuitry which provides surge control. The isolation device is used in industrial systems that have to sense a remote signal. The common mode voltage may be unknown between two devices. This circuit can be a generic signaling device that isolates signals in various industrial areas that are considered harsh environments due to the distance between a transmitted and received signal or input.

The low cost circuit and software isolates and measures AC or DC voltages. The circuit provides the following: low power; wide input voltage range; and/or high EMC immunity. For example, at least one of a surge control or a filter component can be used to provide at least one of low power, wide input voltage range, or high EMC immunity. The circuit can provide the following during operation: the circuit inputs wide range AC or DC voltages in the range of 20 to 400 V DC and 20 to 265 V AC; and/or determination if the input voltage is AC or DC and the input voltage.

The circuit 200 in FIG. 2 provides two major functions as well as a number of secondary protective functions. The major functions are: external contact cleaning and signal translation and isolation.

The circuit provides a contact cleaning function that momentarily causes current to flow through the external actuating contact, thus burning off any contact oxide. In an embodiment, the contact current amplitude is proportional to the applied voltage. The cleaning current duration is inversely proportional to the input voltage amplitude. Depending on circuit values selected the resultant contact cleaning energy can be established to be more or less as the applied voltage rises.

The following is an example of the circuit 200 functionality. Once the external actuating contact closes, the voltage on the output of the rectifier bridge transitions from zero or a low value to a level related to the driving voltage. The power supply 201 energizes and triggers a monostable (e.g., one pulse) timer 202. The timer trigger (labeled TRG) is caused by the trigger input being delayed relative to the power supply rise. The output of the monostable timer (OUT) drives a semiconductor switch (203) that causes power resistors to be applied across the rectified input bus. The power resistors cause a higher current to flow through the inputs and then flow through the external actuating contact. This higher current acts to clear the external contact oxide. The current will be proportional to the input voltage through Ohm's law. The duration of the current flow will be inversely proportional to the input voltage through the configuration of the monostable timer reset threshold (labeled THR). Once the external contact opens there is a trigger reset function that quickly resets the timer trigger.

The subject invention provides a circuit method to transfer information about the input voltage across an isolation barrier to a secondary circuit. This method is low cost, supports a wide range of input voltages, supports DC and AC input voltages, is robust to external EMI waves and has low thermal emissions. The secondary circuit is across the isolation barrier and inputs the transferred information, decodes the information using software or hardware methods and uses the information to make some decision.

The following is an example of the circuit 200 functionality. Once the external actuating contact closes, the voltage on the output of the rectifier bridge transitions from zero or a low value to a level related to the driving voltage. The power supply 201 energizes and triggers a free running timer 204. This free running timer outputs a stream of pulses with the active high portion of the stream having a low duty cycle, wherein the low duty cycle can be, but is not limited to being, in a range of 5% to 15%. In an embodiment, the duty cycle can be 10%. The low duty cycle is relatively constant over all input voltages. The frequency of the pulse train is a direct function of the input voltage. The frequency of the pulse train can be configured to increase or decrease as the input voltage increases. The free running timer output drives the isolation device 105 during the low duty cycle portion. The free running timer drives the output isolation device through protection devices such as common mode chokes or ferrite beads 205 to decrease the effects of high frequency noise seen across the isolation barrier. The isolation device is only on during active high portion of the pulse stream and since the active high portion has a low duty cycle the thermal dissipation in the isolation device is low. The output of the isolation device will have the same frequency and duty cycle as the input. The output of the isolation device is low pass filtered to remove any high frequency noise then the output is digitally buffered. Once buffered, the output can be directly processed as a digital signal by a digital processor. Or the buffered output signal can be converted to a continuous analog signal by passing through a low pass filter. The continuous analog signal can then be read by the processor through an ADC circuit or the signal can be applied to non-digital processor analog circuitry to make some decisions. The non-digital processor analog circuitry can use comparator circuitry.

The secondary functions process the input signal and ensure the circuit operates reliably in all thermal and EMI environments.

Protection against differential conducted EMI (Electromagnetic interference) signals that are widely seen, especially in industrial, power generation and power transmission locations is provided by components like MOVs 207 and capacitance 208. The differential EMI signals will range from slow high energy waves like lightning to fast lower energy waves like Electro Static Discharge (ESD) and Electrical Fast Transients (EFT). The capacitance acts to damp the incident wave. The MOVs acts to damp and clamp the wave.

The circuitry protection against high frequency common mode EMI signals also seen in typical industrial locations is provided by capacitive components 206. ESD and EFT are example waves. The capacitance damps the wave. For low frequency high energy waves like common mode lightning, the circuit is allowed to follow the input voltage without sinking substantial energy, in the process a high voltage common mode voltage is seen by the circuit and no damage is received. The capacitive components and the isolation device are specified to survive this high voltage. Using a high voltage common mode capability allows the circuit to survive the high energy common mode wave without requiring common mode clamping devices like MOVs. Without the common mode clamping devices the circuit is able to be correctly tested for dielectric withstand capability as required for proper circuit operation and as required by safety certification requirements received from UL or European CE mark Low Voltage Directive.

After the input protection devices there is a full wave rectifier to convert any AC signals to a pulsing DC signal. The output of the rectifier for a DC input voltage will be the absolute value of the input wave with about 2 Volts subtracted. Similarly, the output of the rectifier for an AC input voltage will be the absolute value of the AC input wave with about 2 Volts subtracted. The rectified AC wave will have a frequency that is double the input frequency.

On the output of the full wave rectifier there are several more protective devices: a second differential MOV 209 and a second differential capacitance 210. These components work in conjunction with the input protection devices to add additional damping and clamping of incident waves.

The aforementioned systems, circuits, components, and the like have been described with respect to interaction between several components and/or elements. It should be appreciated that such devices and elements can include those elements or sub-elements specified therein, some of the specified elements or sub-elements, and/or additional elements. Further yet, one or more elements and/or sub-elements may be combined into a single component to provide aggregate functionality. The elements may also interact with one or more other elements not specifically described herein.

Figure 3:
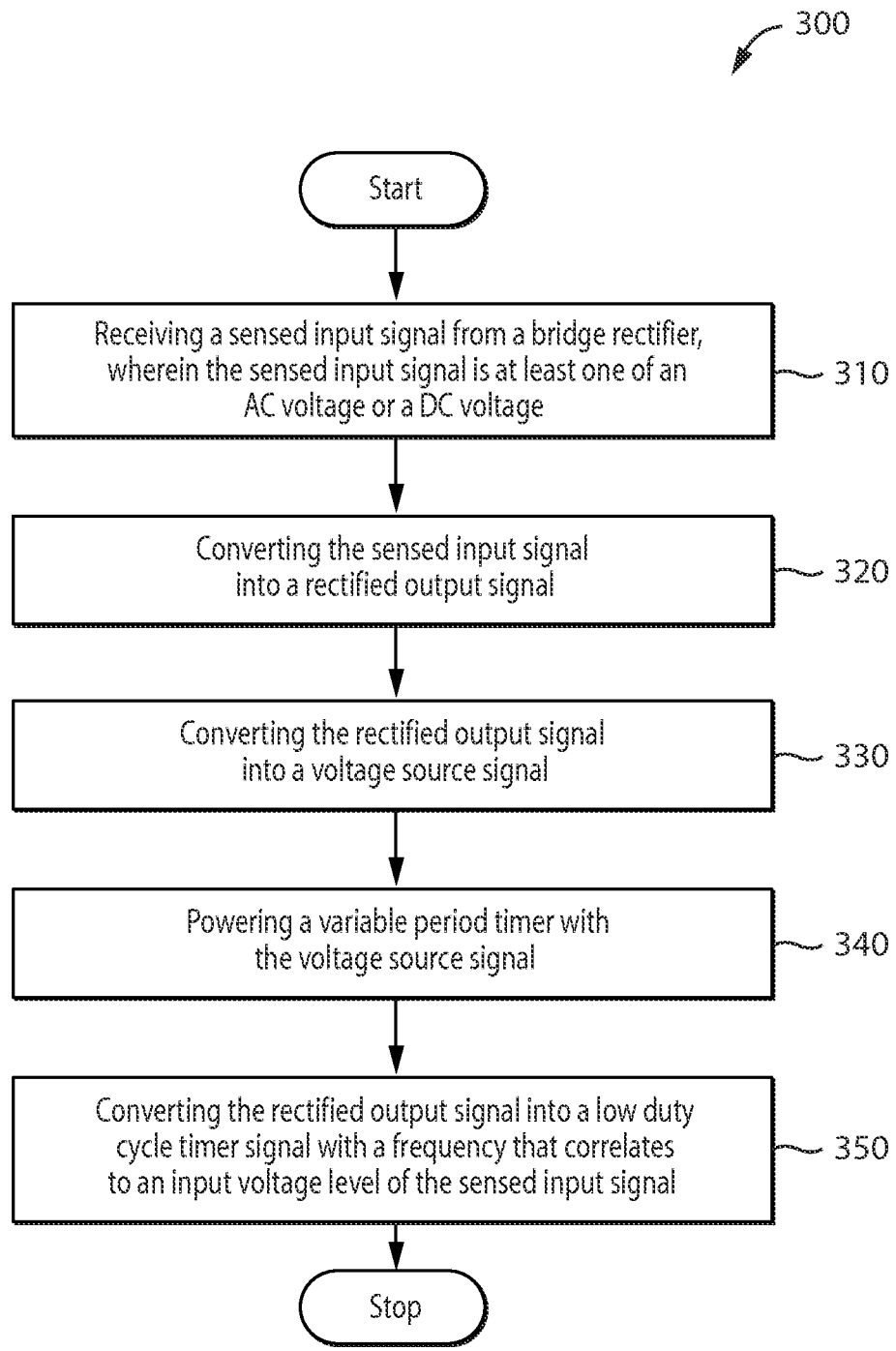
FIG. 3 illustrates a flow chart of an embodiment of a method for isolating a signal.

Methodologies that may be implemented in accordance with the disclosed subject matter will be better appreciated with reference to the flow charts of FIG. 3. The methodologies are shown and described as a series of blocks, the claimed subject matter is not limited by the order of the blocks, as some blocks may occur in different orders and/or concurrently with other blocks from what is depicted and described herein. Moreover, not all illustrated blocks may be required to implement the methods described hereinafter. The methodologies can be implemented by a component or a portion of a component that includes at least a processor, a memory, and an instruction stored on the memory for the processor to execute.

FIG. 3 illustrates a flow chart of a method 300 for operating with one or more input voltage levels of at least one of AC or DC. At reference numeral 310, a sensed input signal is received from an external source, wherein the sensed input signal is at least one of an AC voltage or a DC voltage. At reference numeral 320, the sensed input signal is converted into a rectified output signal. At reference numeral 330, the rectified output signal is converted into a regulated voltage source signal. At reference numeral 340, a variable period timer is controlled with the regulated voltage source. At reference numeral 350, the rectified output signal is converted into a low duty cycle timer signal with a frequency that correlates to an input voltage level of the sensed input signal. In an embodiment, the low duty cycle timer signal can be isolated to produce a frequency information signal that is utilized by a processing device to determine an input voltage level.

In an embodiment, a voltage sensing circuit comprises a bridge rectifier configured to convert a sensed input signal into a rectified output signal, a regulator configured to convert the rectified output signal into a voltage source signal, and a variable period timer configured to be powered by the voltage source signal and to convert the rectified output signal into a low duty cycle timer signal. The low duty cycle timer signal has a frequency that is correlated to an input voltage level of the sensed input signal.

In another embodiment, the voltage sensing circuit is configured to operate on input voltage levels of sensed at least one of alternating current (AC) and/or direct current (DC) input signals over one or more determined dynamic ranges.

In another embodiment, the voltage sensing circuit further comprises an isolation device coupled to an output of the variable period timer and a processing device coupled to an output of the isolation device. The isolation device is configured to output a frequency information signal communicating frequency information of the low duty cycle timer signal to the processing device. The processing device is a software programmable device configured to sample the frequency information signal and execute software instructions to read or determine the frequency of the low duty cycle timer signal.

In another embodiment of the voltage sensing circuit, the isolation device is an optocoupler device.

In another embodiment of the voltage sensing circuit, the sensed input signal is a DC voltage in a range of 20 volts to 400 volts or an AC voltage in a range of 80 volts to 265 volts.

In another embodiment of the voltage sensing circuit, the low duty cycle may vary from about 50% to about 10%.

In another embodiment, the voltage sensing circuit further comprises a circuit that provides surge protection for the sensed input signal.

Another embodiment relates to a method for operating with one or more input voltage levels of at least one of AC or DC. The method comprises receiving a sensed input signal from an external source, wherein the sensed input signal is at least one of an AC voltage or a DC voltage, and converting the sensed input signal into a rectified output signal. The method further comprises converting the rectified output signal into a voltage source signal, powering a variable period timer with the voltage source signal, and converting the rectified output signal into a low duty cycle timer signal with a frequency that correlates to an input voltage level of the sensed input signal.

In another embodiment of the method, the sensed input signal is a DC voltage in a range of 20 volts to 400 volts or an AC voltage in a range of 80 volts to 265 volts.

In another embodiment, the method further comprises converting a frequency information signal communicating frequency information of the low duty cycle timer signal, sampling the frequency information signal, and determining a frequency of the low duty cycle time signal based on the sampling of the frequency information signal.

In another embodiment, the method further comprises isolating the frequency information signal communicating frequency information of the low duty cycle timer signal.

Another embodiment relates to a battery system comprising a bridge rectifier, a regulator, a variable period timer, an isolation device, and a processing device. The bridge rectifier is configured to convert a sensed input signal into a rectified output signal. The regulator is configured to convert the rectified output signal into a voltage source signal. The variable period timer is configured to be powered by the voltage source signal and to convert the rectified output signal into a low duty cycle timer signal and the low duty cycle timer signal has a frequency that is correlated to an input voltage level of the sensed input signal. The voltage sensing circuit is configured to operate on input voltage levels of sensed at least one of alternating current (AC) or direct current (DC) input signals over one or more determined dynamic ranges. The isolation device is coupled to an output of the variable period timer. The processing device is coupled to an output of the isolation device. The isolation device is configured to output a frequency information signal communicating frequency information of the low duty cycle timer signal to the processing device.

In another embodiment of the battery system, the processing device is a software programmable device that includes a microprocessor configured to sample the frequency information signal and execute software instructions to read or determine the frequency of the low duty cycle timer signal.

In another embodiment, the battery system further comprises a circuit that provides surge protection for the sensed input signal.

In another embodiment of the battery system, the sensed input signal is a DC voltage in a range of 20 volts to 400 volts or an AC voltage in a range of 80 volts to 265 volts.

In another embodiment, the battery system further comprises a contact cleaning function (e.g., circuit configured for contact cleaning). For example, the cleaning function may cause a current to flow through an external actuating contact, wherein the circuit burns off contact oxide based on the current flowing through the external actuating contact.

In another embodiment, the battery system further comprises at least one of an MOV or a capacitor, e.g., configured to protect against a differential conducted electromagnetic interference signal.

In the specification and claims, reference will be made to a number of terms that have the following meanings. The singular forms "a", "an" and "the" include plural referents unless the context clearly dictates otherwise. Approximating language, as used herein throughout the specification and clauses, may be applied to modify a quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Moreover, unless specifically stated otherwise, a use of the terms "first," "second," etc., do not denote an order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

This written description uses examples to disclose the invention, including the best mode, and also to enable one of ordinary skill in the art to practice the invention, including making and using a devices or systems and performing incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A voltage sensing circuit, comprising:
    a bridge rectifier configured to convert a sensed input signal into a rectified output signal;
    a regulator configured to convert the rectified output signal into a voltage source signal; and
    a variable period timer configured to be powered by the voltage source signal and to convert the rectified output signal into a low duty cycle timer signal;
    wherein the low duty cycle timer signal has a frequency that is correlated to an input voltage level of the sensed input signal.

2. The voltage sensing circuit of claim 1, wherein the voltage sensing circuit is configured to operate on input voltage levels of sensed at least one of alternating current (AC) or direct current (DC) input signals over one or more determined dynamic ranges.

3. The voltage sensing circuit of claim 1, further comprising an isolation device coupled to an output of the variable period timer and a processing device coupled to an output of the isolation device, wherein the isolation device is configured to output a frequency information signal communicating frequency information of the low duty cycle timer signal to the processing device, and wherein the processing device is a software programmable device configured to sample the frequency information signal and execute software instructions to read or determine the frequency of the low duty cycle timer signal.

4. The voltage sensing circuit of claim 3, wherein the isolation device is an optocoupler device.

5. The voltage sensing circuit of claim 1, wherein the sensed input signal is a DC voltage in a range of 20 volts to 400 volts or an AC voltage in a range of 80 volts to 265 volts.

6. The voltage sensing circuit of claim 1, wherein the low duty cycle may vary from about 50% to about 10%.

7. The voltage sensing circuit of claim 1, further comprising a circuit that provides surge protection for the sensed input signal.

8. A method for operating with one or more input voltage levels of at least one of AC or DC, comprising:
    receiving a sensed input signal from an external source, wherein the sensed input signal is at least one of an AC voltage or a DC voltage;
    converting the sensed input signal into a rectified output signal;
    converting the rectified output signal into a voltage source signal;
    powering a variable period timer with the voltage source signal; and
    converting the rectified output signal into a low duty cycle timer signal with a frequency that correlates to an input voltage level of the sensed input signal.

9. The method of claim 8, wherein the sensed input signal is a DC voltage in a range of 20 volts to 400 volts or an AC voltage in a range of 80 volts to 265 volts.

10. The method of claim 8, further comprising:
    converting a frequency information signal communicating frequency information of the low duty cycle timer signal;
    sampling the frequency information signal; and
    determining a frequency of the low duty cycle time signal based on the sampling of the frequency information signal.

11. The method of claim 10, further comprising isolating the frequency information signal communicating frequency information of the low duty cycle timer signal.

12. A battery system, comprising:
    a bridge rectifier configured to convert a sensed input signal into a rectified output signal;
    a regulator configured to convert the rectified output signal into a voltage source signal;
    a variable period timer configured to be powered by the voltage source signal and to convert the rectified output signal into a low duty cycle timer signal and the low duty cycle timer signal has a frequency that is correlated to an input voltage level of the sensed input signal, wherein the voltage sensing circuit is configured to operate on input voltage levels of sensed at least one of alternating current (AC) or direct current (DC) input signals over one or more determined dynamic ranges;

an isolation device coupled to an output of the variable period timer; and a processing device coupled to an output of the isolation device, wherein the isolation device is configured to output a frequency information signal communicating frequency information of the low duty cycle timer signal to the processing device.

13. The battery system of claim 12, wherein the processing device is a software programmable device that includes a microprocessor configured to sample the frequency information signal and execute software instructions to read or determine the frequency of the low duty cycle timer signal.

14. The battery system of claim 12, further comprising a circuit that provides surge protection for the sensed input signal.

15. The battery system of claim 12, wherein the sensed input signal is a DC voltage in a range of 20 volts to 400 volts or an AC voltage in a range of 80 volts to 265 volts.

16. The battery system of claim 12, further comprising a contact cleaning function.

17. The battery system of claim 16, wherein the cleaning function causes a current to flow through an external actuating contact.

18. The battery system of claim 17, wherein the circuit burns off contact oxide based on the current to flow through the external actuating contact.

19. The battery system of claim 12, further comprising at least one of an MOV or a capacitor.

20. The battery system of claim 19, wherein the at least one of the MOV or the capacitor is configured to protect against a differential conducted electromagnetic interference signal.

\* \* \* \* \*